(12) United States Patent
Wu et al.

(10) Patent No.: US 11,784,033 B2
(45) Date of Patent: Oct. 10, 2023

(54) METHODS AND APPARATUS FOR PROCESSING A SUBSTRATE

(71) Applicant: Applied Materials, Inc., Santa Clara, CA (US)

(72) Inventors: Mengxue Wu, Singapore (SG); Siew Kit Hoi, Singapore (SG); Jay Min Soh, Singapore (SG); Yue Cui, Singapore (SG); Chul Nyoung Lee, Singapore (SG); Palaniappan Chidambaram, Singapore (SG); Jiao Song, Singapore (SG)

(73) Assignee: APPLIED MATERIALS, INC., Santa Clara, CA (US)

( * ) Notice: Subject to any disclaimer, the term of this patent is extended or adjusted under 35 U.S.C. 154(b) by 78 days.

(21) Appl. No.: 17/333,732

(22) Filed: May 28, 2021

(65) Prior Publication Data
US 2022/0384165 A1 Dec. 1, 2022

(51) Int. Cl.
C23C 14/35 (2006.01)
H01J 3/34 (2006.01)
(Continued)

(52) U.S. Cl.
CPC ........ *H01J 37/3476* (2013.01); *C23C 14/345* (2013.01); *C23C 14/3492* (2013.01);
(Continued)

(58) Field of Classification Search
CPC ............... H01J 37/3476; H01J 37/3455; H01J 37/3464; H01J 37/3467; C23C 14/35;
(Continued)

(56) References Cited

U.S. PATENT DOCUMENTS 5,762,766 A 6/1998 Kurita et al.
6,306,265 B1 * 10/2001 Fu .................. H01J 37/3455
204/192.12
(Continued)

FOREIGN PATENT DOCUMENTS

WO WO 2016/098923 A1 6/2016

OTHER PUBLICATIONS

PCT International Search Report and Written Opinion for PCT/US2022/028270 dated Sep. 1, 2022.

*Primary Examiner* — Michael A Band
(74) *Attorney, Agent, or Firm* — MOSER TABOADA

(57) ABSTRACT

Methods and apparatus for processing a substrate are provided herein. For example, a method for processing a substrate comprises applying a DC target voltage to a target disposed within a processing volume of a plasma processing chamber, rotating a magnet disposed above the target at a default speed to direct sputter material from the target toward a substrate support disposed within the processing volume, measuring in-situ DC voltage in the processing volume, the in-situ DC voltage different from the DC target voltage, determining if a measured in-situ DC voltage is greater than a preset value, if the measured in-situ DC voltage is less than or equal to the preset value, maintaining the magnet at the default speed, and if the measured in-situ DC voltage is greater than the preset value, rotating the magnet at a speed less than the default speed to decrease the in-situ DC voltage.

8 Claims, 2 Drawing Sheets

(51) Int. Cl.
  *H01J 37/34*    (2006.01)
  *C23C 14/54*    (2006.01)
  *C23C 14/34*    (2006.01)

(52) U.S. Cl.
  CPC .............. *C23C 14/35* (2013.01); *C23C 14/54* (2013.01); *H01J 37/3405* (2013.01); *H01J 37/3455* (2013.01); *C23C 14/351* (2013.01)

(58) Field of Classification Search
  CPC ... C23C 14/345; C23C 14/3485; C23C 14/54; C23C 14/3492
  See application file for complete search history.

(56) References Cited

U.S. PATENT DOCUMENTS

| | | | |
|---|---|---|---|
| 6,351,075 B1 | 2/2002 | Barankova et al. | |
| 7,112,960 B2 | 9/2006 | Miller et al. | |
| 7,935,232 B2* | 5/2011 | Kuroiwa | C23C 14/358 204/298.22 |
| 8,227,344 B2 | 7/2012 | Selsley et al. | |
| 8,643,454 B2 | 2/2014 | Fullerton et al. | |
| 10,157,733 B2* | 12/2018 | Zhang | H01J 37/3444 |
| 10,312,065 B2* | 6/2019 | Riker | H01L 21/3065 |
| 2013/0186743 A1 | 7/2013 | Mizuno | |
| 2014/0238844 A1 | 8/2014 | Chistyakov | |
| 2018/0025895 A1 | 1/2018 | Riker et al. | |
| 2018/0335294 A1 | 11/2018 | Ausserlechner | |
| 2020/0176234 A1 | 6/2020 | Abraham et al. | |

\* cited by examiner

METHODS AND APPARATUS FOR PROCESSING A SUBSTRATE

FIELD

Embodiments of the present disclosure generally relate to a methods and apparatus for processing a substrate, and more particularly, embodiments of the disclosure relate to a logic feedback system configured to manipulate magnet rotation speed based on DC voltage reading.

BACKGROUND

Conventional plasma processing (physical vapor deposition) chambers use one or more magnets to facilitate directing sputter material plasma toward a substrate. For example, magnetron assemblies can be positioned above a target disposed within a processing volume of the processing chamber. The magnetron can comprise a plurality of magnets that are configured to produce a magnetic field within the processing chamber near a front face of the target to generate plasma so a significant flux of ions strike the target, causing sputter emission of target material toward a substrate. During conventional sputtering, the plurality of magnets can be rotated at a default speed and a DC voltage can be applied to the target to facilitate sputter emission.

High DC voltages, however, can sometimes trigger processing chamber faults, which, in turn, can increase processing chamber down time. Additionally, the high DC voltages can cause target bow issues, low unsustainable processing throughput throughout target life, unstable plasma sustainability in the processing chamber, unbalanced target erosion profile throughout target life, and can affect a deposition rate of a film, deposition profile of the film (e.g., inconsistent thickness across a substrate), etc.

SUMMARY

Methods and apparatus for processing a substrate are provided herein. In some embodiments, a method for processing a substrate comprises applying a DC target voltage to a target disposed within a processing volume of a plasma processing chamber, rotating a magnet disposed above the target at a default speed to direct sputter material from the target toward a substrate support disposed within the processing volume, measuring in-situ DC voltage in the processing volume, the in-situ DC voltage different from the DC target voltage, determining if a measured in-situ DC voltage is greater than a preset value, if the measured in-situ DC voltage is less than or equal to the preset value, maintaining the magnet at the default speed, and if the measured in-situ DC voltage is greater than the preset value, rotating the magnet at a speed less than the default speed to decrease the in-situ DC voltage.

In accordance with at least some embodiments, a non-transitory computer readable storage medium has stored thereon instructions that when executed by a processor perform a method for processing a substrate comprising applying a DC target voltage to a target disposed within a processing volume of a plasma processing chamber, rotating a magnet disposed above the target at a default speed to direct sputter material from the target toward a substrate support disposed within the processing volume, measuring in-situ DC voltage in the processing volume, the in-situ DC voltage different from the DC target voltage, determining if a measured in-situ DC voltage is greater than a preset value, if the measured in-situ DC voltage is less than or equal to the preset value, maintaining the magnet at the default speed, and if the measured in-situ DC voltage is greater than the preset value, rotating the magnet at a speed less than the default speed to decrease the in-situ DC voltage.

In accordance with at least some embodiments, a system for plasma processing a substrate comprises a DC power source configured to provide a DC target voltage to a target disposed within a processing volume of a plasma processing chamber, a magnetron assembly comprising a magnet disposed above the target and rotatable along a pathway at a default speed, and a controller configured to apply the DC target voltage to the target, rotate the magnet at the default speed to direct sputter material from the target toward a substrate support disposed within the processing volume, measure an in-situ DC voltage in the processing volume, the in-situ DC voltage different from the DC target voltage, determine if a measured in-situ DC voltage is greater than a preset value, if the measured in-situ DC voltage is less than or equal to the preset value, maintain the magnet at the default speed, and if the measured in-situ DC voltage is greater than the preset value, rotate the magnet at a speed less than the default speed to decrease the in-situ DC voltage.

Other and further embodiments of the present disclosure are described below.

BRIEF DESCRIPTION OF THE DRAWINGS

Embodiments of the present disclosure, briefly summarized above and discussed in greater detail below, can be understood by reference to the illustrative embodiments of the disclosure depicted in the appended drawings. However, the appended drawings illustrate only typical embodiments of the disclosure and are therefore not to be considered limiting of scope, for the disclosure may admit to other equally effective embodiments.

Figure 1:
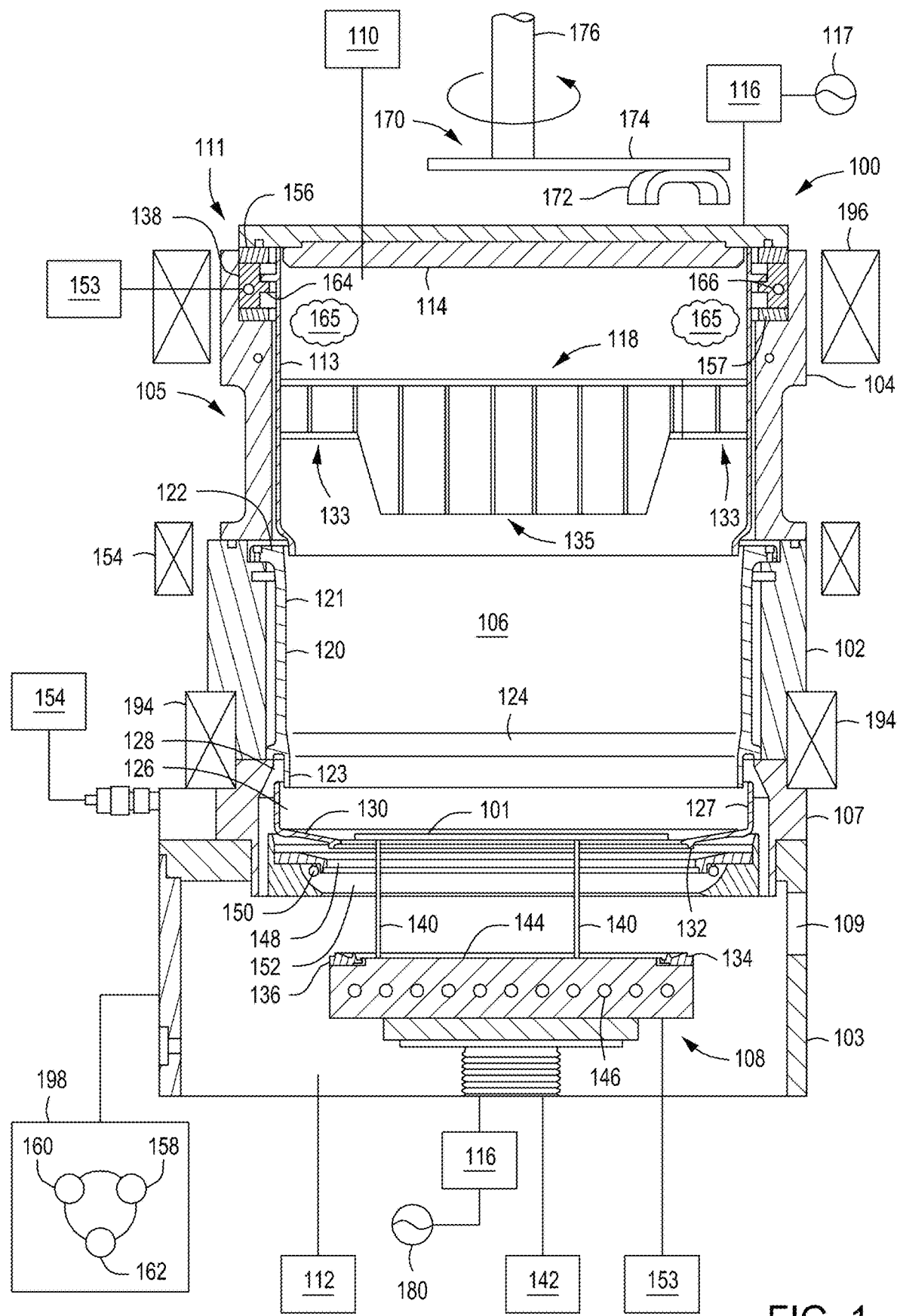
FIG. 1 is a schematic cross-sectional view of a processing chamber, in accordance with at least some embodiments of the present disclosure.

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

Embodiments of a methods and apparatus for processing a substrate are provided herein. For example, the methods and apparatus described herein provide improved ways to manipulate target voltage, target erosion, and deposition rate via magnet rotation speed tuning. For example, a controller can control magnet rotation speed, e.g., at a default speed. Next, the controller can measure in-situ DC voltage, e.g., voltage between the target and the substrate support. For example, if the measured in-situ DC voltage is less than or equal to a preset value, the controller can maintain the magnet at the default speed. If the measured in-situ DC voltage is greater than the preset value, the controller is configured to rotate the magnet at a speed less than the default speed to decrease the in-situ DC voltage. The methods and apparatus described herein provide a logic feedback system for controlling the magnet rotation and achieve multiple benefits without having to increase the needs for an additional hardware. Additionally, the high DC voltage issues that can trigger chamber fault and increase tool down time are decreased, if not eliminated. Moreover, the methods and apparatus described herein provide a solution for high aspect ratio through-silicon via (TSV) void, can maintain hardware reliability and achieve a reduction in target bow, can provide high processing chamber throughput, provide plasma sustainability in the processing chamber, can sustain film properties throughout a target life, and can balance target erosion profile throughout a target life (e.g., longer target life).

FIG. 1 depicts a schematic side view of a processing chamber 100 (e.g., a plasma processing chamber). In some embodiments, the processing chamber 100 is PVD processing chamber suitable for sputter depositing materials on a substrate having a given diameter. Illustrative examples of suitable PVD chambers that may be adapted to benefit from the present disclosure include those commercially available from Applied Materials, Inc., of Santa Clara, California Other processing chambers available from Applied Materials, Inc. as well as other manufacturers may also be adapted in accordance with the embodiments described herein.

The processing chamber 100 generally includes an upper sidewall 102, a lower sidewall 103, a ground adapter 104, and a lid assembly 111 defining a body 105 that encloses an interior volume 106 (processing volume). An adapter plate 107 may be disposed between the upper sidewall 102 and the lower sidewall 103.

A substrate support 108 is disposed in the interior volume 106 of the processing chamber 100. The substrate support 108 is configured to support a substrate having a given diameter (e.g., 150 mm, 200 mm, 300 mm, 450 mm, or the like). A substrate transfer port 109 is formed in the lower sidewall 103 for transferring substrates into and out of the interior volume 106.

A gas source 110 is coupled to the processing chamber 100 to supply process gases into the interior volume 106. In some embodiments, process gases may include inert gases, non-reactive gases, and reactive gases, if necessary. Examples of process gases that may be provided by the gas source 110 include, but are not limited to, argon gas (Ar), helium (He), neon gas (Ne), nitrogen gas ($N_2$), oxygen gas ($O_2$), and water ($H_2O$) vapor, among others.

A pumping device 112 is coupled to the processing chamber 100 in communication with the interior volume 106 to control the pressure of the interior volume 106. In some embodiments, during deposition the pressure level of the processing chamber 100 may be maintained from about 1 mTorr to about 1 Torr, e.g., from about 300 mTorr to about 500 mTorr.

The ground adapter 104 may support a target, such as target 114. The target 114 is fabricated from a material to be deposited on the substrate. In some embodiments, the target 114 may be fabricated from titanium (Ti), tantalum (Ta), tungsten (W), cobalt (Co), nickel (Ni), copper (Cu), aluminum (Al), alloys thereof, combinations thereof, or the like. In some embodiments, the processing chamber 100 is configured to deposit, for example, aluminum oxide ($AlO_2$), aluminum oxynitride (such as ALON), Co, Cu, Ta, tantalum nitride (TaN), tantalum oxynitride (TaOxNy), Ti, titanium oxynitride (TiOxNy), W, or tungsten nitride (WN) on a substrate.

The target 114 may be coupled to a source assembly comprising a power supply 117 for the target 114. In some embodiments, the power supply 117 may be an RF power supply, which may be coupled to the target 114 via a matching network 116. In some embodiments, the power supply 117 may alternatively be a DC power supply, in which case the matching network 116 is omitted. In some embodiments, the power supply 117 may include both DC and RF power sources. The power supply 117 can provide RF power to achieve a target voltage of about 500V to about 1000V, e.g., 870V, at a frequency from about 400 Hz to about 60 MHz, such as about 2, MHz, 13.56 MHz, 27.12 MHz to the target 114. Similarly, the DC power supply can provide a target voltage of about 500V to about 1000 V, e.g., 870V.

A magnetron 170 is positioned above the target 114 and may include a plurality of magnets 172 supported by a base plate 174 connected to a shaft 176, which may be axially aligned with the central axis of the processing chamber 100 and the substrate 101. The magnets 172 produce a magnetic field within the processing chamber 100 near the front face of the target 114 to generate plasma 165 so a significant flux of ions strike the target 114, causing sputter emission of target material. The magnets 172 may be rotated about the shaft 176 to increase uniformity of the magnetic field across the surface of the target 114. In general, magnets 172 may be rotated such that the innermost magnet position during rotation of the magnets 172 is disposed above or outside of the diameter of the substrate being processed (e.g., the distance from the axis of rotation to the innermost position of the magnets 172 is equal to or greater than the diameter of the substrate being processed). Moreover, the magnets 172 may be rotated to achieve a suitable dwell time during operation. A dwell time is a duration spent per inch, along a pathway of the magnets 172. A dwell time is dependent on a radius of magnet motion (e.g., about 6 inches to about 7) inches and a rotation speed of a magnet. Additionally, a dwell time can affect an ionization of ions. For example, if a dwell time is too short (e.g., due to large radius or high rotation speed) there will be insufficient ionization of ions.

A collimator 118 can be positioned in the interior volume 106 between the target 114 and the substrate support 108. A central region 135 of the collimator 118 generally corresponds to the diameter of the substrate being processed (e.g., is equal to or substantially equal to the diameter of the substrate). Thus, a peripheral region 133 of the collimator 118 generally corresponds to an annular region radially outward of the substrate being processed (e.g., the inner diameter of the peripheral region 133 is substantially equal to or greater than the diameter of the substrate). In some embodiments, the collimator 118 may be electrically biased to control ion flux to the substrate and neutral angular distribution at the substrate, as well as to increase the deposition rate due to the added DC bias.

The collimator 118 is coupled to an upper shield 113, which in turn is coupled to the process tool adapter 138. The process tool adapter 138 may be made from suitable conductive materials compatible with processing conditions in the processing chamber 100. An insulator ring 156 and an insulator ring 157 are disposed on either side of the process tool adapter 138 to electrically isolate the process tool adapter 138 from the ground adapter 104. The insulator rings 156, 157 may be made from suitable process compatible dielectric materials.

In some embodiments, a first set of magnets 196 may be disposed adjacent to the ground adapter 104 to assist with generating the magnetic field to guide dislodged ions from the target 114 through the peripheral region 133. In some embodiments, a second set of magnets 194 may be disposed in a position to form a magnetic field between the bottom of the collimator 118 and the substrate to guide the metallic ions dislodged from the target 114 and distribute the ions more uniformly over the substrate 101. In some embodiments, a third set of magnets 154 may be disposed between the first and second set of magnets 196, 194 and about centered with or below a substrate-facing surface of the central region 135 of the collimator 118 to further guide the metallic ions towards the center of the substrate 101.

The process tool adapter 138 includes one or more features to facilitate supporting a process tool within the interior volume 106, such as the collimator 118. For example, as shown in FIG. 1, the process tool adapter 138 includes a mounting ring, or shelf 164 that extends in a radially inward direction to support the upper shield 113.

In some embodiments, a coolant channel 166 may be provided in the process tool adapter 138 to facilitate flowing a coolant through the process tool adapter 138 to remove heat generated during processing. For example, the coolant channel 166 may be coupled to a cooling apparatus 153 (coolant source) to provide a suitable coolant, such as water (deionized water), nitrogen, argon, or other noble gas, clean dry air (CDA), or corrosive gas, etc. The coolant channel 166 advantageously removes heat from the process tool (e.g., collimator 118) that is not readily transferred to other cooled chamber components, such as the ground adapter 104.

A radially inwardly extending ledge (e.g., the mounting ring, or shelf 164) is provided to support the upper shield 113 within the central opening within the interior volume 106 of the processing chamber 100. In some embodiments the shelf 164 is disposed in a location proximate the coolant channel 166 to facilitate maximizing the heat transfer from the collimator 118 to the coolant flowing in the coolant channel 166 during use.

In some embodiments, a lower shield 120 may be provided in proximity to the collimator 118 and interior of the ground adapter 104 or the upper sidewall 102. The lower shield 120 may include a tubular body 121 having a radially outwardly extending flange 122 disposed in an upper surface of the tubular body 121. The flange 122 provides a mating interface with an upper surface of the upper sidewall 102. In some embodiments, the tubular body 121 of the lower shield 120 may include a shoulder region 123 having an inner diameter that is less than the inner diameter of the remainder of the tubular body 121. In some embodiments, the inner surface of the tubular body 121 transitions radially inward along a tapered surface 124 to an inner surface of the shoulder region 123. A shield ring 126 may be disposed in the processing chamber 100 adjacent to the lower shield 120 and intermediate of the lower shield 120 and the adapter plate 107. The shield ring 126 may be at least partially disposed in a recess 128 formed by an opposing side of the shoulder region 123 of the lower shield 120 and an interior sidewall of the adapter plate 107.

In some embodiments, the shield ring 126 may include an axially projecting annular sidewall 127 that has an inner diameter that is greater than an outer diameter of the shoulder region 123 of the lower shield 120. A radial flange 130 extends from the annular sidewall 127. The radial flange 130 includes a protrusion 132 formed on a lower surface of the radial flange 130. The protrusion 132 may be a circular ridge extending from the surface of the radial flange 130 in an orientation that is substantially parallel to the inside diameter surface of the annular sidewall 127 of the shield ring 126. The protrusion 132 is generally adapted to mate with a recess 134 formed in an edge ring 136 disposed on the substrate support 108. The recess 134 may be a circular groove formed in the edge ring 136. The engagement of the protrusion 132 and the recess 134 centers the shield ring 126 with respect to the longitudinal axis of the substrate support 108. The substrate 101 (shown supported on lift pins 140) is centered relative to the longitudinal axis of the substrate support 108 by coordinated positioning calibration between the substrate support 108 and a robot blade (not shown).

An RF power source 180 may be coupled to the processing chamber 100 through the substrate support 108 to provide a bias power between the target 114 and the substrate support 108. In some embodiments, a match network (e.g., the matching network 116) can be coupled between the RF power source 180 and the substrate support 108. In some embodiments, the RF power source 180 may have a frequency between about 400 Hz and about 60 MHz, such as about 13.56 MHz.

In operation, a robot blade (not shown) having the substrate 101 disposed thereon is extended through the substrate transfer port 109. The substrate support 108 may be lowered to allow the substrate 101 to be transferred to the lift pins 140 extending from the substrate support 108. Lifting and lowering of the substrate support 108 and/or the lift pins 140 may be controlled by a drive 142 coupled to the substrate support 108. The substrate 101 may be lowered onto a substrate receiving surface 144 of the substrate support 108. With the substrate 101 positioned on the substrate receiving surface 144 of the substrate support 108, sputter deposition may be performed on the substrate 101. The edge ring 136 may be electrically insulated from the substrate 101 during processing.

After sputter deposition, the substrate 101 may be elevated utilizing the lift pins 140 to a position that is spaced away from the substrate support 108. The elevated location may be proximate one or both of the shield ring 126 and a reflector ring 148 adjacent to the adapter plate 107. The adapter plate 107 includes one or more lamps 150 coupled to the adapter plate 107 at a position intermediate of a lower surface of the reflector ring 148 and a concave surface 152 of the adapter plate 107. The lamps 150 provide optical and/or radiant energy in the visible or near visible wavelengths, such as in the infra-red (IR) and/or ultraviolet (UV) spectrum. The energy from the lamps 150 is focused radially inward toward the backside (i.e., lower surface) of the substrate 101 to heat the substrate 101 and the material deposited thereon.

After controlling the substrate 101 to a predetermined temperature, the substrate 101 is lowered to a position on the substrate receiving surface 144 of the substrate support 108. The substrate 101 may be rapidly cooled utilizing thermal control channels 146 in the substrate support 108 via conduction. For example, the cooling apparatus 153 can be connected to the substrate support 108 and be configured to provide one or more coolants to the substrate support. The substrate 101 may be removed from the processing chamber 100 through the substrate transfer port 109 for further processing.

A controller 198 is coupled to the processing chamber 100. The controller 198 includes a central processing unit 160, a memory 158, and support circuits 162. The controller 198 is utilized to control the process sequence, regulating the gas flows from the gas source 110 into the processing chamber 100 and controlling ion bombardment of the target 114. The central processing unit 160 may be of any form of a general-purpose computer processor that can be used in an industrial setting. The software routines (e.g., instructions) can be stored in the memory 158 (e.g., non-transitory computer readable storage medium), such as random-access memory, read only memory, floppy or hard disk drive, or other form of digital storage. The support circuits 162 are conventionally coupled to the central processing unit 160 and may comprise cache, clock circuits, input/output subsystems, power supplies, and the like. The software routines, when executed by the central processing unit 160, transform the central processing unit into a specific purpose computer that controls the processing chamber 100 such that the processes, including the substrate support 108 cooling processes disclosed below, are performed in accordance with embodiments of the present disclosure. The software routines may also be stored and/or executed by a second controller (not shown) that is located remotely from the processing chamber 100.

During processing, material is sputtered from the target 114 and deposited on the surface of the substrate 101. The target 114 and the substrate support 108 are biased relative to each other by the power supply 117 or the RF power source 180 to maintain a plasma formed from the process gases supplied by the gas source 110. The DC pulsed bias power applied to the collimator 118 also assists controlling ratio of the ions and neutrals passing through the collimator 118, advantageously enhancing the trench sidewall and bottom fill-up capability. The ions from the plasma are accelerated toward and strike the target 114, causing target material to be dislodged from the target 114. The dislodged target material and process gases forms a layer on the substrate 101 with desired compositions.

Figure 2:
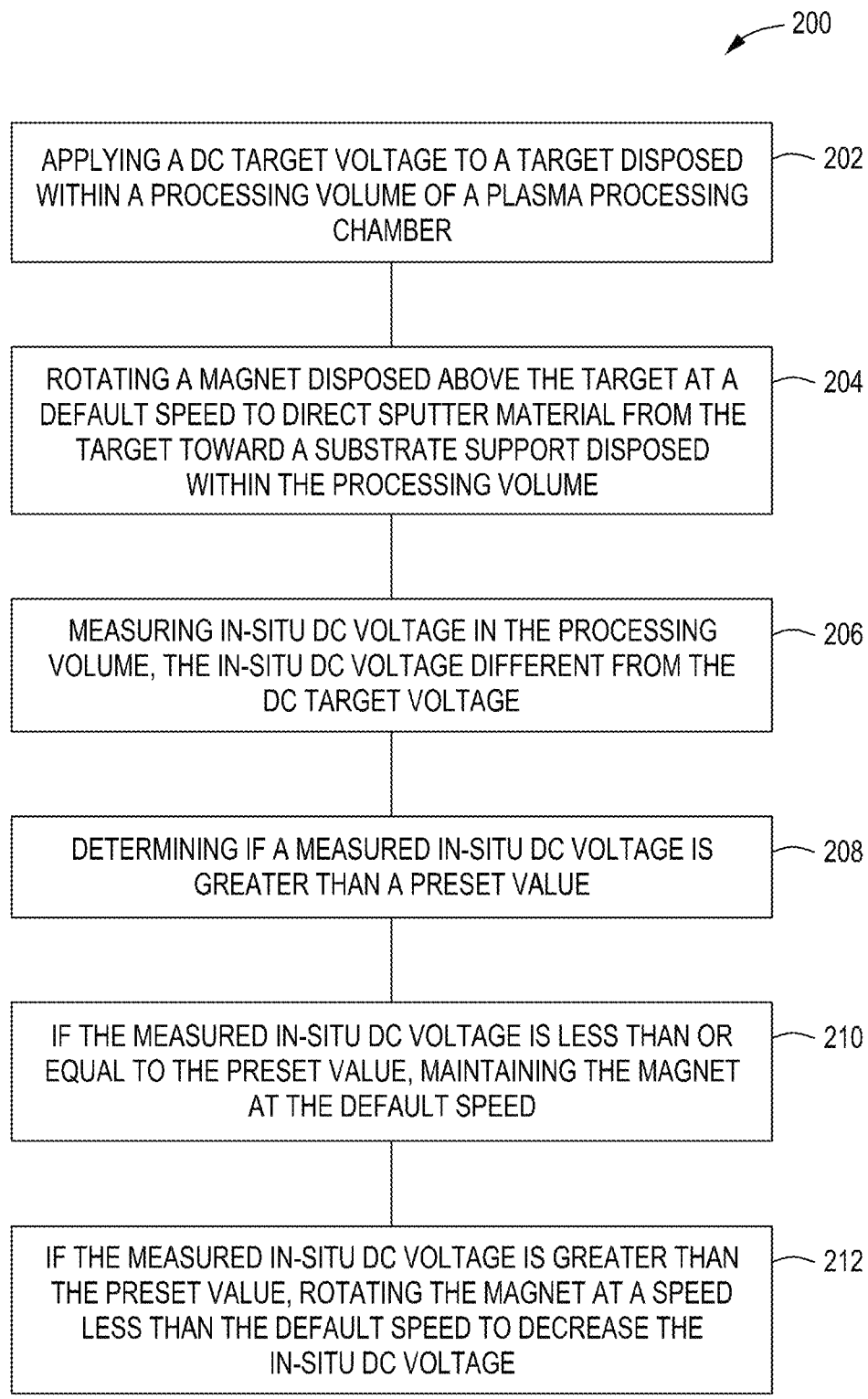
FIG. 2 is a flowchart of a method for processing a substrate, in accordance with at least some embodiments of the present disclosure.

FIG. 2 is a flowchart of a method 200 for processing a substrate, in accordance with at least some embodiments of the present disclosure. For example, at 202, the method 200 comprises applying a DC target voltage to a target disposed within a processing volume of a plasma processing chamber. For example, at 202, the power supply 117 (e.g., a DC power supply) can apply a DC target voltage of about 1000V.

Next, at 204, the method 200 comprises rotating a magnet disposed above the target at a default speed to direct sputter material from the target toward a substrate support disposed within the processing volume. For example, the shaft 176 of the magnetron 170 can be rotated at a default speed of about 0.5 rps to about 1.2 rps to rotate the magnet 172 to direct sputter material from the target 114 toward the substrate support 108 disposed within the interior volume 106. The default speed is based on a dwell time for a radius of a substrate (e.g., 75 mm, 100 mm, 1500 mm, 225 mm) to be plasma processed. Accordingly, at 204, the magnet 172 can be rotated along a pathway including a magnet radius of rotation that is at least equal to a radius of the substrate. For example, a magnet radius of rotation can be about 3 inches to about 8.9 inches (e.g., about 6 inches to about 7 inches).

Next, at 206, the method 200 comprises measuring in-situ DC voltage in the processing volume, the in-situ DC voltage different from the DC target voltage. For example, the controller 198 can measure, using one or more suitable sensors (not shown) to measure the in-situ DC voltage. The in-situ DC voltage is a voltage measured between the target 114 and the substrate support 108 (and/or a substrate 101). Conversely, the DC target voltage is a DC voltage that is applied to the target to facilitate sputtering.

Next, at 208, the method 200 comprises determining if a measured in-situ DC voltage is greater than a preset value. For example, the controller 198 is configured to determine if the measured in-situ DC voltage is greater than the preset value (e.g., about 1000V).

Next, at 210, the method 200 comprises if the measured in-situ DC voltage is less than or equal to the preset value, maintaining the magnet at the default speed. For example, if the measured in-situ DC voltage is less than or equal to the preset value, the method 200 comprises maintaining the magnet 172 at the default speed.

Next, at 212, the method 200 comprises if the measured in-situ DC voltage is greater than the preset value, rotating the magnet at a speed less than the default speed to decrease the in-situ DC voltage. For example, if the measured in-situ DC voltage greater than the preset value, the method 200 comprises rotating the magnet at the speed less than the default speed, e.g., less than about 1.2 rps. The default speed is processing chamber and target dependent. For example, in at least some embodiments, the magnet speed can be decreased to less than about 0.5 rps. At 212, method 200 comprises maintaining the DC target voltage to the target. Alternatively, the DC target voltage to the target can decreased.

In at least some embodiments, 206-212 can be performed continuously during operation (e.g., substrate processing). Alternatively, 206-212 can be performed at predetermined time intervals that correspond to a specific recipe.

While the foregoing is directed to embodiments of the present disclosure, other and further embodiments of the disclosure may be devised without departing from the basic scope thereof.

The invention claimed is:

1. A method for processing a substrate comprising:
applying a DC target voltage to a target disposed within a processing volume of a plasma processing chamber;
rotating a magnet disposed above the target at a default speed to direct sputter material from the target toward a substrate support disposed within the processing volume;
controlling an in-situ DC voltage in the processing volume via controlling rotating of the magnet;
measuring the in-situ DC voltage in the processing volume, the in-situ DC voltage measured between the target and the substrate support and is different from the DC target voltage;
determining if a measured in-situ DC voltage is greater than a preset value;
if the measured in-situ DC voltage is less than or equal to the preset value, maintaining the magnet at the default speed; and
if the measured in-situ DC voltage is greater than the preset value, rotating the magnet at a speed less than the default speed to decrease the in-situ DC voltage.

2. The method of claim 1, wherein the default speed is based on a radius of the substrate to be plasma processed.

3. The method of claim 1, wherein rotating the magnet at the speed less than the default speed is based on a dwell time for a radius of the substrate to be plasma processed, and wherein the dwell time is a duration spent per inch along a pathway of the magnet.

4. The method of claim 1, wherein maintaining the magnet at the default speed and rotating the magnet at the speed less than the default speed is performed while maintaining the DC target voltage to the target.

5. The method of claim 1, wherein a magnet radius of rotation is about 6 inches to about 7 inches.

6. The method of claim 1, wherein the preset value is 1000V.

7. The method of claim 1, wherein the in-situ DC voltage is about 870V to about 1000V.

8. The method of claim 1, wherein rotating the magnet comprises rotating the magnet at about 0.5 rps to about 1.2 rps.

* * * * *